(12) United States Patent
Chu et al.

(10) Patent No.: US 9,286,975 B2
(45) Date of Patent: Mar. 15, 2016

(54) MITIGATING READ DISTURB IN A CROSS-POINT MEMORY

(71) Applicant: Intel Corporation, Santa Clara, CA (US)

(72) Inventors: Daniel J. Chu, Folsom, CA (US); Kiran Pangal, Fremont, CA (US); Nathan R. Franklin, San Mateo, CA (US); Prashant S. Damle, Santa Clara, CA (US); Hu Chaohong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/204,376

(22) Filed: Mar. 11, 2014

(65) Prior Publication Data

US 2015/0262661 A1 Sep. 17, 2015

(51) Int. Cl.
*G11C 11/00* (2006.01)
*G11C 13/00* (2006.01)
*G11C 11/56* (2006.01)

(52) U.S. Cl.
CPC .......... *G11C 13/004* (2013.01); *G11C 11/5678* (2013.01); *G11C 13/0004* (2013.01); *G11C 13/0033* (2013.01); *G11C 13/0035* (2013.01); *G11C 2013/0052* (2013.01)

(58) Field of Classification Search
CPC ............. G11C 13/0004; G11C 13/004; G11C 11/5678; G11C 13/0033; G11C 13/0035; G11C 2013/0052
USPC ............. 365/163, 181, 186, 189.011, 189.14, 365/189.15, 196, 207
See application file for complete search history.

(56) References Cited

U.S. PATENT DOCUMENTS

| | | |
|---|---|---|
| 2008/0013370 A1 | 1/2008 | Johnson |
| 2008/0117669 A1 | 5/2008 | Fuji et al. |
| 2011/0012082 A1 | 1/2011 | Tio Castro |
| 2011/0317480 A1 | 12/2011 | Lung et al. |
| 2014/0056090 A1 | 2/2014 | Kwon et al. |
| 2014/0362650 A1* | 12/2014 | Castro ................... 365/189.011 |

OTHER PUBLICATIONS

International Search Report and Written Opinion received for PCT Application No. PCT/US2015/019366, mailed on May 19, 2015, 10 pages.

* cited by examiner

*Primary Examiner* — Fernando Hidalgo
(74) *Attorney, Agent, or Firm* — Grossman, Tucker, Perreault & Pfleger, PLLC

(57) ABSTRACT

The present disclosure relates to mitigating read disturb in a cross-point memory. An apparatus may include a memory controller configured to select a target memory cell for a memory access operation. The memory controller includes a sense module configured to determine whether a snap back event occurs during a sensing interval; and a write back module configured to write back a logic one to the memory cell if a snap back event is detected.

12 Claims, 4 Drawing Sheets

MITIGATING READ DISTURB IN A CROSS-POINT MEMORY

FIELD

The present disclosure relates to mitigating read disturb a cross-point memory array.

BACKGROUND

Phase change memory is a memory device which typically uses a chalcogenide material for the memory elements. A memory element is the unit that actually stores information. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory elements may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

During a programming operation, the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state. Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage across the memory element is configured to be greater than a maximum set voltage and less than a minimum reset voltage for the memory element. In response, the target memory element may or may not snap back, depending on whether the memory element is in the crystalline state (set) or the amorphous state (reset). Sense circuitry (including a sense node), coupled to the memory element, is configured to detect the presence or absence of snap back in a sensing time interval. The presence of snap back may then be interpreted as a logic one and the absence of snap back as a logic zero.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
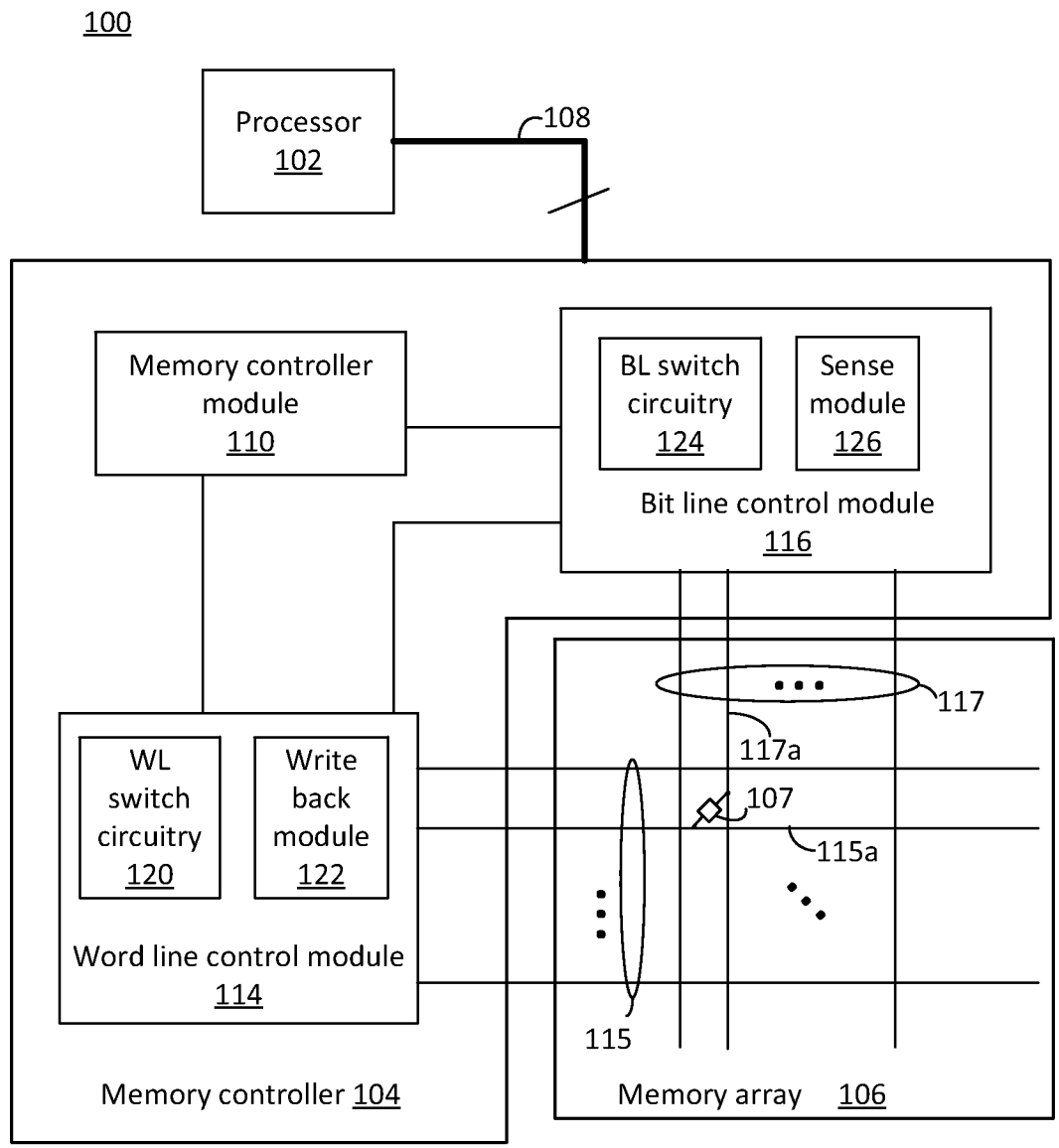
FIG. 1 illustrates a system block diagram consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

During a read operation of a memory element in the set state, snap back may result in a "read disturb", i.e., weak programming of the memory element from the set state to the reset state. The abrupt change in voltage associated with snap back combined with an effective capacitance associated with memory circuitry (e.g., electrodes, bit lines, word lines, etc.) results in a spike in current with a rate of decay (i.e., RC time constant) that is related to the effective capacitance. The current may then result in heating of the memory element and the weak programming. Such read disturb may be reduced by reducing the effective capacitance of the memory element by, for example, decoupling a target WL from voltage source(s) during the sensing interval. However, as memory cell array size continues to scale, effective capacitance may increase due to increased tile size to maintain array efficiency and/or reduced cell pitch associated with the scaling.

A sense margin is also related to effective capacitance. The sense node may be coupled to a target memory cell during a sense interval. A sense signal, i.e., voltage and/or current, detected at the sense node may then be related to a state of the memory cell. For example, at a start of the sense interval a voltage across the memory cell may correspond to the differential bias voltage applied to the memory cell for the read operation. For a memory cell in the reset state, this voltage may remain unchanged over the sense interval and the signal detected at the sense node may also remain unchanged. For a memory cell in the set state, the memory cell may snap back during the sense interval resulting in a relatively dramatic change in voltage across the memory cell as current flows through the memory cell. The differential voltage across the memory cell may then decrease and this change in voltage may be detected at the sense node. Thus, a change in voltage corresponds to a snap back event (memory cell state: set) and absence of a change in voltage corresponds to absence of a snap back event (memory cell state: reset). Sense margin is the difference between the sense signal that corresponds to a memory cell in the reset state and the sense signal that corresponds to the memory cell in the set state.

The voltage (V) across the memory cell developed during a snap back event is related to the effective capacitance (C) and charge (Q) by $VC=Q$, assuming that the voltage is independent of the capacitance. The voltage developed during a snap back event may be independent of capacitance when at least one of the BL and WL are not floating. The sense signal may then correspond to a transfer of the charge Q from the memory cell to the sense node. The charge Q, is proportional to the capacitance C, so if C is relatively higher, then the charge Q is relatively higher for a same voltage V. An increased charge Q may then result in a relatively larger sense margin and a decreased susceptibility to noise in the sensing system. In the case of a read disturb, increased charge Q developed during snap back corresponds to increased current through the memory cell and an increased likelihood of read disturb. Decreasing effective capacitance also decreases the sense margin resulting in a trade-off between decreasing effective capacitance to reduce read disturb and maintaining effective capacitance to maintain sense margin.

Generally, this disclosure describes a system and method configured to mitigate read disturb (i.e., weak programming) from snap back associated with reading a memory element that is in the set state (i.e., is storing a logic one). The method and system are configured to output the logic one and to write back the logic one to the memory element in response to the snap back. The method and system are further configured to maintain coupling (i.e., selection) of a selected WL (word line) to a WL select voltage source during a sensing interval. For example, a local WL select switch configured to couple the selected WL to the WL select voltage source may be controlled ON or partially OFF during at least a portion of the sensing interval. If the local WL select switch is partially OFF, it may be turned ON in response to a snap back being detected. The local WL select switch partially OFF is configured to reduce a write back time interval (i.e., a time duration of the write back operation) and, thus an associated read completion time interval. The read completion time interval begins at a start of a sensing interval and ends at completion of the write back operation. The local WL select switch ON is configured to reduce a read latency (i.e., a time interval starting with initiating a read operation and ending when read sense data is ready). If snap back is detected, after the snap back the local WL source voltage may be transitioned to a SET type pulse to recrystallize the memory element and address any read disturb (i.e., amorphization) that may have occurred during the read operation.

The method and system are further configured to maintain a sense margin by maintaining effective capacitance. Effective capacitance includes parasitic capacitance, coupling capacitance and/or electrode capacitance associated with a target WL (or bit line (BL)).

In the following, techniques for mitigating read disturb are described with respect to word lines. Similar techniques may be utilized to mitigate read disturb in a cross-point memory for bit lines, consistent with the present disclosure.

FIG. 1 illustrates a system block diagram 100 consistent with several embodiments of the present disclosure. The system 100 includes a processor 102, a memory controller 104 and a memory array 106. The processor 102 is coupled to the memory controller 104 by bus 108. Processor 102 may provide read and/or write requests including memory address(es), and/or associated data to memory controller 104 and may receive read data from memory controller 104. Memory controller 104 is configured to perform memory access operations, e.g., reading a target memory cell and/or writing to a target memory cell. It should be noted that system 100 is simplified for ease of illustration and description.

Memory array 106 corresponds to at least a portion of a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 106 is configured to store binary data and may be written to (i.e., programmed) or read from.

Memory controller 104 includes memory controller module 110, WL control module 114 and BL control module 116. Memory controller module 110 is configured to perform operations associated with memory controller 104. For example, memory controller module 110 may manage communications with processor 102. Memory controller module 110 may be configured to identify one or more target WLs associated with each received memory address. Memory controller module 110 may be configured to manage operations of WL control module 114 and BL control module 116 based, at least in part, on the target WL identifiers.

WL control module 114 includes WL switch circuitry 120 and write back module 122. In some embodiments WL control module 114 may include a sense module, e.g., sense module 126 shown in BL control module 116. WL control module 114 is configured to receive target WL address(es) from memory controller module 110 and to select one or more WLs for reading and/or writing operations. WL control module 114 may be configured to select a target WL by coupling a WL select bias voltage $V_{SELWL}$ to the target WL and may be configured to deselect a WL by coupling a WL deselect bias voltage $V_{DESWL}$ to the WL. WL control module 114 may be coupled to a plurality of WLs 115 included in memory array 106. Each WL may be coupled to a number of memory cells corresponding to a number of BLs 117.

WL switch circuitry 120 may include a plurality of switches, each switch configured to couple (or decouple) a respective WL, e.g., WL 115a, to $V_{SELWL}$ to select the respective WL 115a. For example, switch circuitry 120 may include a plurality of transistors. In some embodiments, WL switch circuitry 120 may include switches that are configured to have a full ON state, a full OFF state and/or a partially OFF state. Full ON corresponds to very low impedance (e.g., shorted) and full OFF corresponds to very high impedance (e.g., open circuit). Partially OFF corresponds to a conduction state between open and shorted.

Sense module 126 is configured to detect a snap back event, e.g., during a read operation, and to communicate the snap back event to, e.g., memory controller 110 and/or write back module 122. Write back module 122 is configured to control WL switch circuitry 120 to maintain a selected memory cell, e.g., memory cell 107, coupled to $V_{SELWL}$ for a time interval of sufficient duration to program memory cell 107 back to a set state. Write back module 122 is configured to control switch circuitry 120 in response to a snap back event during a read operation.

BL control module 116 includes BL switch circuitry 124. BL control module 116 may include the sense module 126. In some embodiments, BL control module 116 may include a write back module, e.g., write back module 122. In some embodiments, WL control module 114 may include sense module 126. BL control module 116 is configured to select one or more BLs for reading and/or writing operations. BL control module 116 may be configured to select a target BL by coupling a BL select bias voltage $V_{SELBL}$ to the target BL and may be configured to deselect a BL by coupling a BL deselect bias voltage $V_{DESBL}$ to the BL. BL switch circuitry 124 is similar to WL switch circuitry 120 except BL switch circuitry 124 is configured to couple $V_{SELBL}$ to a target BL.

For example, in response to a signal from memory controller module 110, WL control module 114 and BL control module 116 may be configured to select a target memory cell, e.g. memory cell 107, for a read operation by coupling WL 115a to $V_{SELWL}$ and BL 117a to $V_{SELBL}$. Sense module 126 may then be configured to monitor WL 115a and/or BL 117a for a sensing interval in order to determine whether or not a snap back event occurs. If sense module 126 detects a snap back event, then memory cell 107 may be in the set state and write back module 122 may be configured to program memory cell 107 to the set state. If sense module 126 does not detect a snap back event in the sensing interval, then memory cell 107 may be in the reset state and memory cell 107 may not be programmed by write back module 122 in response to the associated read operation.

Thus, WL control module 114 and/or BL control module 116 may be configured to select a target memory cell for a read operation, initiate the read operation, monitor the selected memory cell for a snap back event in a sensing interval and program the selected memory cell if a snap back event is detected during the sensing interval. In this manner, read disturb may be mitigated by the write back operation.

Figure 2:
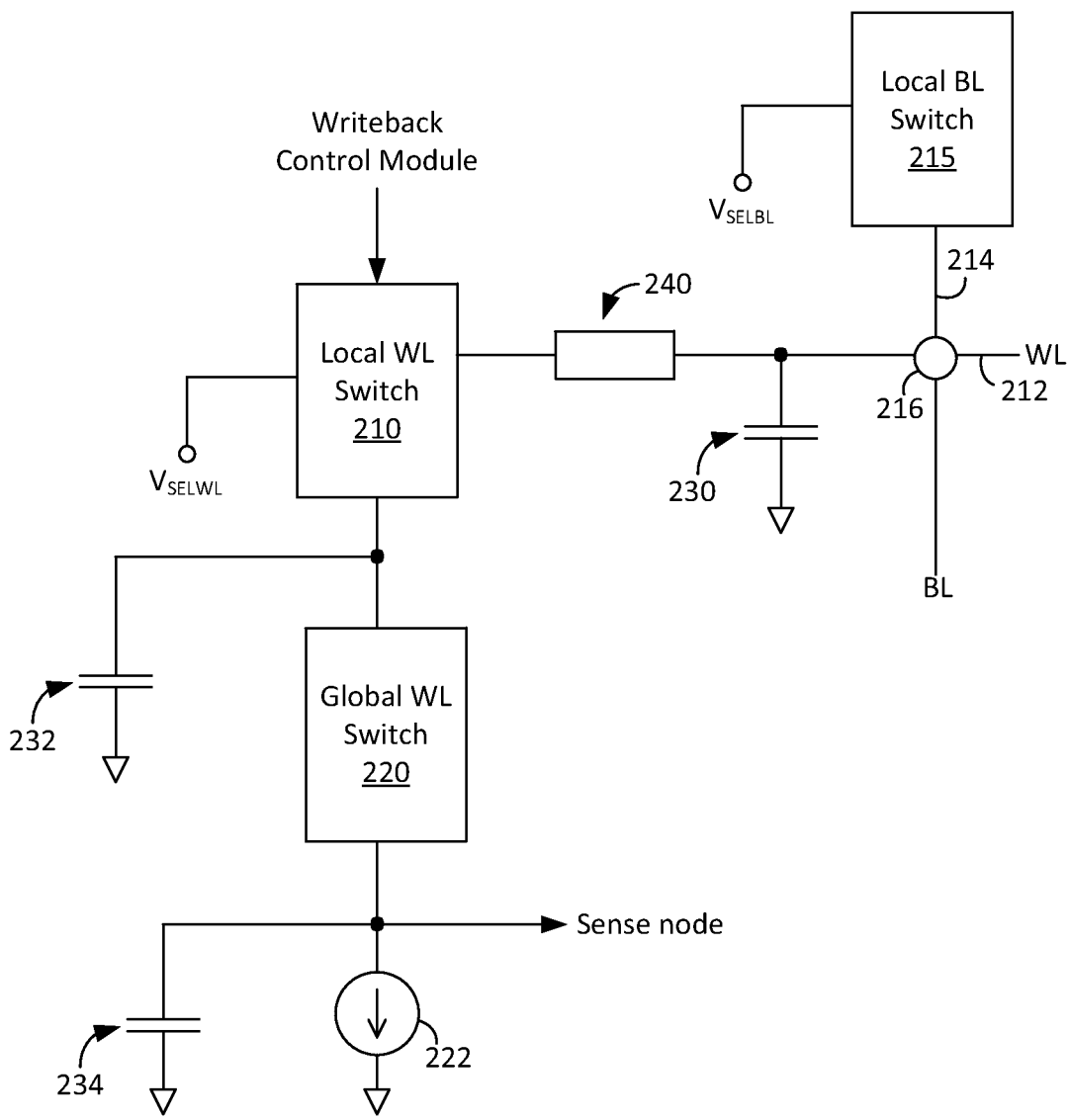
FIG. 2 illustrates a portion of a cross-point memory system consistent with one embodiment of the present disclosure.

FIG. 2 illustrates a portion 200 of a cross-point memory system consistent with one embodiment of the present disclosure. The portion 200 includes a local WL switch 210, a local BL switch 215, a global WL switch 220, a current mirror 222 and a WL 212 and a BL 214 that cross at and are coupled to memory cell 216. The portion 200 further includes a plurality of capacitances 230, 232, 234. Global WL switch 220 in the ON state is configured to enable a sensing path between memory cell 216 and sense node when local WL switch 210 is also ON (or partially OFF).

The capacitances 230, 232, 234 correspond to parasitic capacitances associated with cross-point memory system portion 200. Capacitance 230 corresponds to the capacitance of the WL 212, from memory cell 216 to local WL switch 210. Capacitance 232 corresponds to the capacitance of a circuit between the local WL switch 210 and the global WL switch 220. Capacitance 234 corresponds to a capacitance associated with a central circuit node that is coupled to a plurality of global WLs (not shown). Thus, capacitances 230, 232, 234 are related to routing, devices and/or local coupling associated with cross-point memory systems.

In some embodiments, portion 200 may include resistance 240. Resistance 240 may be added in series between local WL switch 210 and WL 212 to isolate other capacitances coupled to memory cell 216. These other capacitances may charge up in response to current flow but their charging rates may be limited by resistance 240 according to an RC time constant where R is the resistance value of resistance 240 and C is the capacitance value associated with each of the other capacitances.

Current mirror 222 is configured to facilitate a write back process after a snap back event during a read operation, as described herein. Current mirror 222 is configured to supply a current configured to SET the memory cell 216 (in other words, write back) if a snap back has been detected.

Local WL switch 210 is configured to couple WL 212 to WL select voltage $V_{SELWL}$ and local BL switch 215 is configured to couple BL 214 to BL select voltage $V_{SELBL}$. For example, $V_{SELWL}$ may be coupled to WL 212 and $V_{SELBL}$ may be coupled to BL 214 in response to a read request that includes memory cell 216. Initially, global WL switch 220, local WL switch 210 and local BL switch 215 may be OFF and WL 212 may be coupled to a WL deselect voltage $V_{DESWL}$ (not shown) and BL 214 may be coupled to BL deselect voltage $V_{DESBL}$ (not shown). In response to the read request, global WL switch 220 may be turned ON to couple sense node to local WL switch 210, local BL switch 215 may be turned ON to couple BL 214 to $V_{SELBL}$ and local WL switch 210 may be turned ON to couple WL 212 to $V_{SELWL}$ and to global WL switch 220. After a time interval configured to allow capacitances 230, 232, 234 to achieve steady state (i.e., charge up), a sensing interval may begin. In an embodiment, local WL switch 210 may remain ON (i.e., low impedance state) during the sensing interval. In another embodiment, local WL switch 210 may be controlled to a partially OFF state (i.e., controlled, intermediate impedance state) at or near the start of the sensing interval and maintained partially OFF during the sensing interval if no snap back occurs (i.e., memory cell state reset) or turned full ON in response to a snap back event. Controlling local WL switch 210 to the partially OFF state is configured to reduce the effective capacitance during the sensing interval (and a snap back event, if any). Controlling local WL switch 210 to the partially OFF state is further configured to reduce a write back time (compared to local WL switch 210 full OFF during the sensing interval) and thus, a read completion time. Local WL switch 210 partially OFF corresponds to an increased effective resistance of the switch 210 (compared to a relatively low impedance of a switch in the full ON state). The increased effective resistance controls (limits) a maximum current that may flow through the local WL switch 210. In other words, local WL switch 210 in the partially OFF state acts a current limiting resistance. Thus, although a relatively larger capacitance associated with circuitry is coupled to the local WL select switch 210, the peak current that may flow through the cell is limited by the partially OFF switch 210. A time period associated with charging the relatively larger capacitance with the limited current flow may be relatively longer. Cross-point memory cells consistent with the present disclosure may be disturbed by relatively high currents, thus allowing the limited current on for an extended period of time may limit read disturb.

Maintaining local WL switch 210 in the ON state during the sensing interval is configured to reduce read latency (i.e., read sense data ready). Maintaining local WL switch 210 in the ON state facilitates developing the sense signal on the sense node as local WL switch 210 in the ON state allows current to flow out and be detected by the sense circuit, e.g., sense module 126. If a snap back is detected, determining a read result, a write back may then be initiated, as described herein.

A sense module, e.g., sense module 126 of FIG. 1, may be coupled to sense node and configured to determine whether or not a snap back event occurs during the sensing interval. If a snap back is detected, then memory cell 216 may be in the set state and write back control module is configured to control local WL switch 210 to write (i.e. program) a logic one to memory cell 216. One snap back event may result in only a partially destructive read so that write back control module may be configured to provide less than a full SET pulse (a partial SET pulse) to memory cell 216. Providing less than the full SET pulse is configured to reduce and/or minimize a read latency effect associated with the write back. A duration of a full SET pulse may affect read latency and may impact read bandwidth (a number of reads that may be performed in a time interval). A duration of the partial SET pulse is less than a duration of the full SET pulse. The partial SET pulse is configured to SET memory cell 216 after a snap back event associated with a read operation configured to reduce a read disturb, consistent with the present disclosure. Read latency effects may be further reduced by transferring memory cell state data (i.e., a logic one) as soon as the snap back is detected and allowing the write back to continue in the background. If a snap back is not detected during the sensing interval, then memory cell 216 may be in the reset state and no write back may be initiated. In this case, a logic zero may be output.

Figure 3:
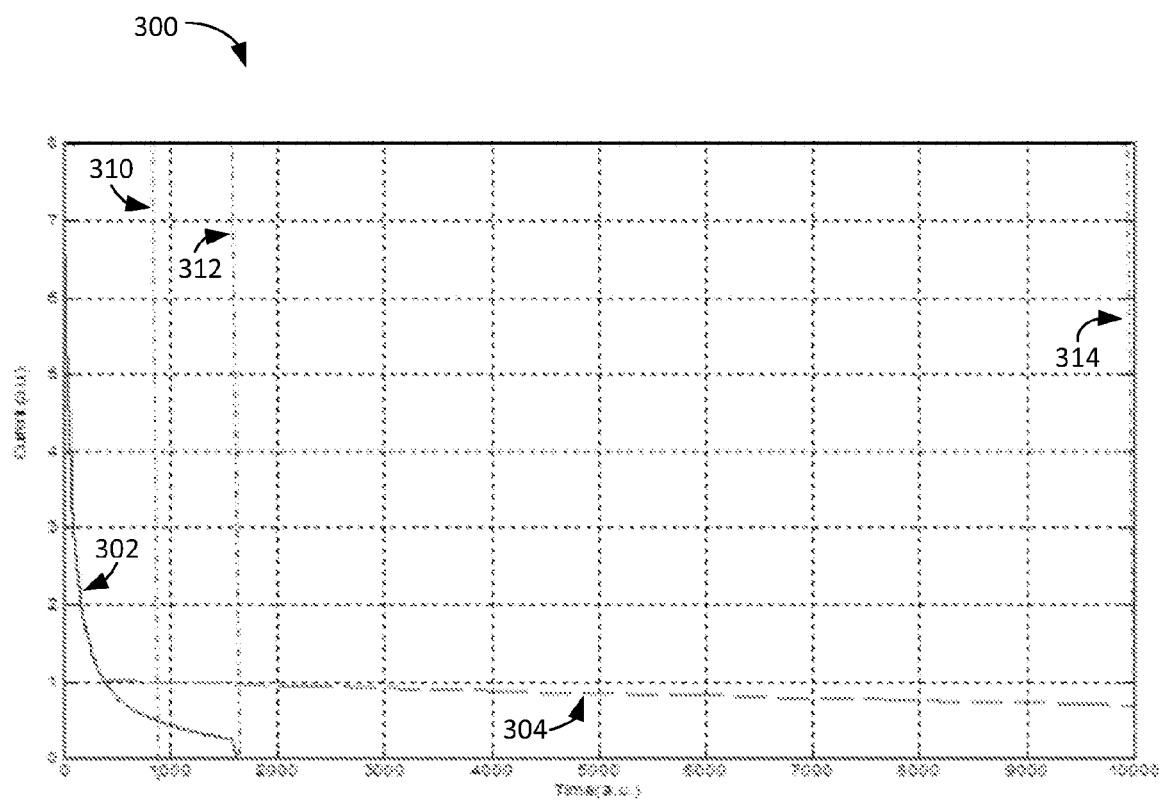
FIG. 3 is a plot illustrating a comparison of a memory cell current profiles for a memory cell in a set state.

FIG. 3 is a plot 300 illustrating a comparison of a memory cell current profiles for a memory cell in a set state. Plot 300 is configured to illustrate relative current levels and relative times between a system configured to open (i.e., turn full OFF) a respective local WL switch, e.g., local WL switch 210, during a sensing interval and a system configured to maintain the local WL switch ON or partially OFF, as described herein. Thus, the vertical axis corresponds to current in arbitrary units (a.u.) and the horizontal axis corresponds to time in arbitrary units (a.u.). Waveform 302 illustrates a snap back event associated with a read operation when the respective local WL switch is full OFF. Waveform 304 illustrates a current profile following a snap back event when the local WL switch is maintained ON or controlled to partially OFF during the snap back event and maintained ON until the write back completes. Time 310 corresponds to read latency (i.e., read sense data ready) and read operation complete for waveform 302. Time 312 corresponds to read latency for a method and system consistent with the present disclosure and time 314 corresponds to a read completion time (i.e., read operation complete). It should be noted that time 314 includes the time interval associated with a write back operation, as described herein. Thus, the logic one may have been output prior to time 314, e.g., at or near time 312.

Time 310 corresponds to read sense data ready when a memory cell, e.g., memory cell 107 of FIG. 1 and/or memory cell 216 of FIG. 2, is in the reset state (i.e., storing a logic zero) whether the respective local WL switch is ON or OFF. In other words, when the memory cell is in the reset state, the memory cell remains in the high impedance state and a differential bias voltage (i.e., $V_{SELBL}$ minus $V_{SELWL}$) is insufficient to cause snap back, thus current may not flow through the memory cell.

Figure 4:
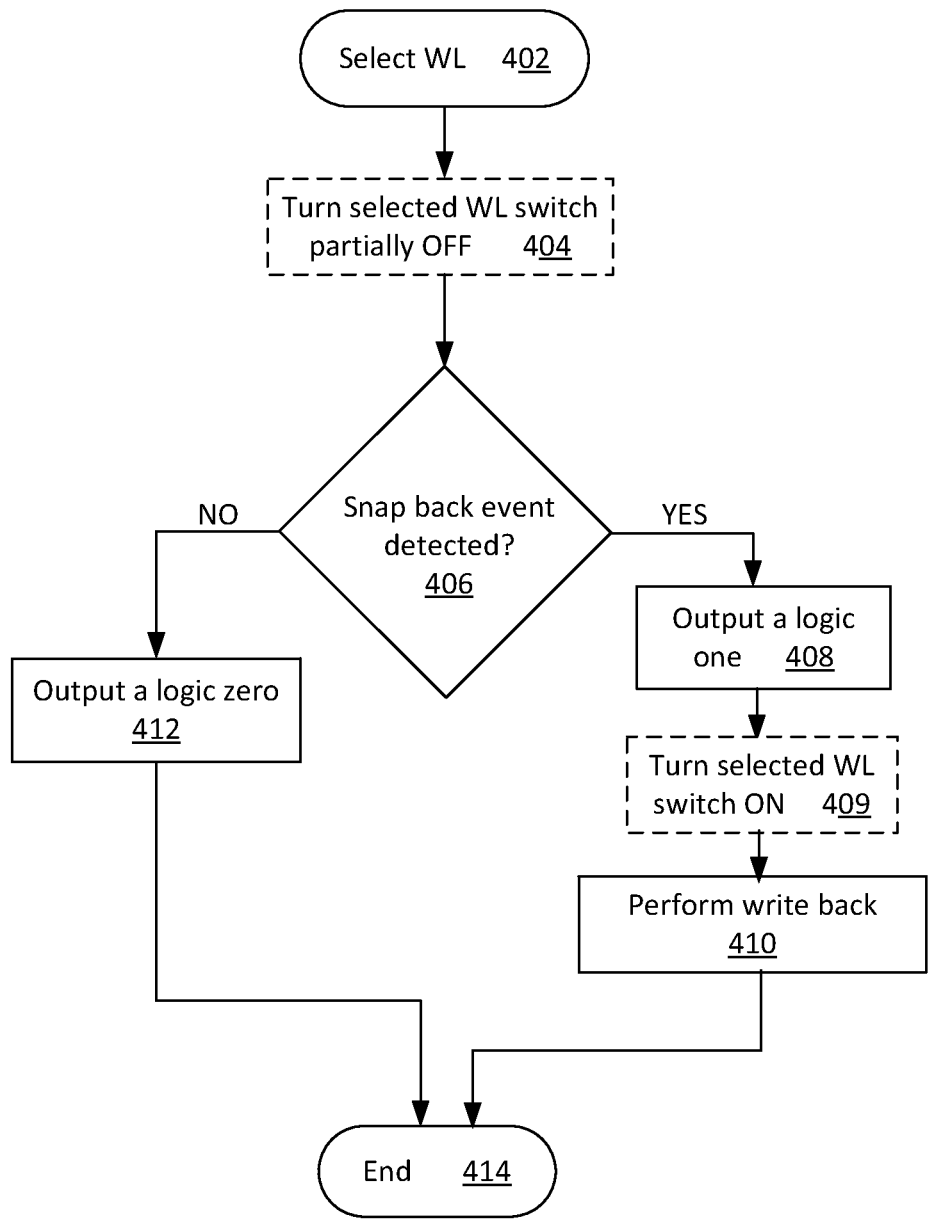
FIG. 4 illustrates a flowchart of operations for mitigating a read disturb consistent with various embodiments of the present disclosure.

FIG. 4 illustrates a flowchart 400 of operations for mitigating read disturb in a cross-point memory consistent with various embodiments of the present disclosure. The operations may be performed, for example, by a memory controller, e.g., memory controller 104, including WL control module 114 and BL control module 116. Flowchart 400 depicts exemplary operations configured to mitigate read disturb. In particular, flowchart 400 depicts exemplary operations configured to write back a logic one to a memory cell if snap back is detected (indicating that the memory cell is in the set state), as described herein.

Operations of flowchart 400 may begin with selecting a WL at operation 402. For example, the WL may be selected by coupling the WL to a WL select voltage via a local WL switch. For example, the local WL switch may be a transistor and may be transitioned from an OFF state to an ON state to couple the WL to the WL select voltage. In some embodiments, the selected WL switch may transition to partially OFF at operation 404. Transitioning the selected WL switch from ON to partially OFF is configured to reduce the effective WL capacitance during a sense interval, as described herein. Whether a snap back event is detected may be determined at operation 406. Occurrence of a snap back event is configured to indicate that a state of an associated memory cell is a logic one. If a snap back event is detected, a logic one may be output at operation 408. In embodiments that include operation 404, the selected WL switch may be turned ON at operation 409. A write back of the logic one may be performed at operation 410. For example, write back may include transitioning the local WL switch to full ON if it is partially OFF when the snap back occurs. In another example, write back may include maintaining the local WL switch full ON until the write back completes. Program flow may then end at operation 414. If a snap back event is not detected, a logic zero may be output at operation 412. Program flow may then end at operation 414.

Thus, the operations of flowchart 400 are configured to initiate a read operation on a target memory cell and to output a logic one and write back the logic one if a snap back event is detected. A read disturb as a result of the snap back event may be accommodated (i.e., mitigated) by writing back the logic one to the memory cell.

While FIG. 4 illustrates various operations according one embodiment, it is to be understood that not all of the operations depicted in FIG. 4 are necessary for other embodiments. Indeed, it is fully contemplated herein that in other embodiments of the present disclosure, the operations depicted in FIG. 4 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smart phones, etc.

In some embodiments, a hardware description language may be used to specify circuit and/or logic implementation(s) for the various modules and/or circuitry described herein. For example, in one embodiment the hardware description language may comply or be compatible with a very high speed integrated circuits (VHSIC) hardware description language (VHDL) that may enable semiconductor fabrication of one or more circuits and/or modules described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, a system and method configured to mitigate read disturb (i.e., weak programming) from snap back associated with reading a memory element that is in the set state (i.e., is storing a logic one) has been described. The method and system are configured to output the logic one and to write back the logic one to the memory cell in response to the snap back. The method and system are further configured to maintain coupling of a selected WL (word line) to a WL select voltage source during at least a portion of a sensing interval.

According to one aspect there is provided an apparatus. The apparatus includes a memory controller module configured to select a target memory cell for a memory access operation. The memory controller includes a sense module configured to determine whether a snap back event occurs during a sensing interval; and a write back module configured to write back a logic one to the memory cell if a snap back event is detected.

According to another aspect there is provided a method. The method includes selecting, by a memory controller, a target memory cell for a memory access operation; determining, by a sense module, whether a snap back event occurs during a sensing interval; and writing back, by a write back module, a logic one to the memory cell if a snap back event is detected.

According to another aspect there is provided a system. The system includes a processor; a cross-point memory array including a target memory cell, a target word line (WL) and a target bit line (BL), the target memory cell coupled between the target WL and the target BL; and a memory controller coupled to the processor and the cross-point memory array. The memory controller is configured to select a target memory cell for a memory access operation. The memory controller includes a sense module configured to determine whether a snap back event occurs during a sensing interval; and a write back module configured to write back a logic one to the memory cell if a snap back event is detected.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
a memory controller configured to select a target memory cell for a memory access operation, the memory controller comprising:
   a sense module configured to determine whether a snap back event occurs during a sensing interval of a read completion time interval; and
   a write back module configured to write back, during said read completion time interval, a logic one to the memory cell in response to a snap back event being detected during said read completion time interval; and
   switch circuitry comprising a word line (WL) switch configured to couple a target WL to a WL select voltage source, and a bit line (BL) switch configured to couple a target BL to a BL select voltage source;
   wherein the memory controller is configured to control the switch circuitry to turn at least one of the WL switch or the BL switch partially OFF at or near the start of the sensing interval and to turn said at least one of the WL switch or the BL switch ON in response to a snap back event being detected during said read completion time interval.

2. The apparatus of claim 1, wherein the memory controller is controller configured to control the switch circuitry to turn the WL switch and the BL switch ON prior to a start of the sensing interval.

3. The apparatus of claim 1, wherein the memory controller is configured to output a logic one if a snap back event is detected.

4. The apparatus of claim 1, wherein the memory controller is configured to output a logic zero if a snap back event is not detected.

5. A method comprising:
selecting, by a memory controller, a target memory cell for a memory access operation;
determining, by a sense module, whether a snap back event occurs during a sensing interval of a read completion time interval;
writing back, by a write back module during said read completion time interval, a logic one to the memory cell in response to a snap back event being detected during said read completion time interval;
controlling, by the memory controller, switch circuitry to turn at least one of a WL switch or a BL switch partially OFF at or near the start of the sensing interval; and
controlling, by the memory controller, the switch circuitry to turn said at least one of the WL switch or the BL switch ON in response to a snap back event being detected during said read completion time interval.

6. The method of claim 5, further comprising:
controlling, by the memory controller, the switch circuitry to turn a word line (WL) switch and a bit line (BL) switch ON prior to a start of the sensing interval.

7. The method of claim 5, further comprising:
outputting, by the memory controller, a logic one if a snap back event is detected.

8. The method of claim 5, further comprising:
outputting, by the memory controller, a logic zero if a snap back event is not detected.

9. A system comprising:
a processor;
a cross-point memory array comprising a target memory cell, a target word line (WL) and a target bit line (BL), the target memory cell coupled between the target WL and the target BL;
a memory controller coupled to the processor and the cross-point memory array, the memory controller configured to select a target memory cell for a memory access operation, the memory controller comprising:
   a sense module configured to determine whether a snap back event occurs during a sensing interval of a read completion time interval; and
   a write back module configured to write back, during said read completion time interval, a logic one to the memory cell in response to a snap back event being detected during said read completion time interval; and
   switch circuitry comprising a word line (WL) switch configured to couple a target WL to a WL select voltage source, and a bit line (BL) switch configured to couple a target BL to a BL select voltage source;
   wherein the memory controller is configured to control the switch circuitry to turn at least one of the WL switch or the BL switch partially OFF at or near the start of the sensing interval and to turn said at least one of the WL switch or the BL switch ON in response to a snap back event being detected during said read completion time interval.

10. The system of claim 9, wherein the memory controller is controller configured to control the switch circuitry to turn the WL switch and the BL switch ON prior to a start of the sensing interval.

11. The system of claim 9, wherein the memory controller is configured to output a logic one if a snap back event is detected.

12. The system of claim 9, wherein the memory controller is configured to output a logic zero if a snap back event is not detected.

* * * * *